(12) United States Patent
Lai et al.

(10) Patent No.: US 9,576,803 B2
(45) Date of Patent: Feb. 21, 2017

(54) METHOD FOR TUNING METAL GATE WORK FUNCTION BEFORE CONTACT FORMATION IN FIN-SHAPED FIELD EFFECT TRANSISTOR MANUFACTURING PROCESS

(71) Applicant: UNITED MICROELECTRONICS CORPORATION, Hsinchu (TW)

(72) Inventors: Kuo-Chih Lai, Tainan (TW); Yang-Ju Lu, Changhua (TW); Ching-Yun Chang, Huwei Township (TW); Yen-Chen Chen, Tainan (TW); Shih-Min Chou, Tainan (TW); Yun Tzu Chang, Kaohsiung (TW); Fang-Yi Liu, Pingtung (TW); Hsiang-Chieh Yen, Magong (TW); Nien-Ting Ho, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/710,619

(22) Filed: May 13, 2015

(65) Prior Publication Data

US 2016/0336181 A1 Nov. 17, 2016

(51) Int. Cl.
*H01L 21/20* (2006.01)
*H01L 21/28* (2006.01)
*H01L 21/3213* (2006.01)
*H01L 29/45* (2006.01)
*H01L 29/66* (2006.01)

(52) U.S. Cl.
CPC ... *H01L 21/28176* (2013.01); *H01L 21/32139* (2013.01); *H01L 29/456* (2013.01); *H01L 29/665* (2013.01); *H01L 29/66795* (2013.01)

(58) Field of Classification Search
CPC ........... H01L 29/4966; H01L 21/28185; H01L 21/28088
See application file for complete search history.

(56) References Cited

U.S. PATENT DOCUMENTS

| | | | |
|---|---|---|---|
| 6,773,978 B1 * | 8/2004 | Besser | H01L 21/28052 257/407 |
| 8,664,070 B2 | 3/2014 | Liu | |
| 2006/0022276 A1 * | 2/2006 | Park | H01L 27/0629 257/368 |
| 2012/0223397 A1 * | 9/2012 | Yang | H01L 21/28088 257/411 |
| 2013/0032893 A1 * | 2/2013 | Pal | H01L 23/485 257/379 |
| 2014/0065802 A1 * | 3/2014 | Chang | H01L 21/845 438/479 |
| 2014/0077281 A1 * | 3/2014 | Won | H01L 21/823842 257/288 |
| 2015/0155365 A1 * | 6/2015 | Lee | H01L 29/4966 257/412 |

\* cited by examiner

*Primary Examiner* — Zandra Smith
*Assistant Examiner* — Evan Clinton
(74) *Attorney, Agent, or Firm* — Ding Yu Tan

(57) ABSTRACT

The present invention provides a method for metal gate work function tuning before contact formation in a fin-shaped field effect transistor (FinFET), where in the method comprises the following steps. (S1) providing a substrate having a metal gate structure on a side of the substrate, (S2) forming a titanium nitride (TiN) layer on the side of the substrate, and (S3) performing a gate annealing to tune work function of the metal gate structure.

9 Claims, 15 Drawing Sheets

METHOD FOR TUNING METAL GATE WORK FUNCTION BEFORE CONTACT FORMATION IN FIN-SHAPED FIELD EFFECT TRANSISTOR MANUFACTURING PROCESS

FIELD OF THE INVENTION

The present invention is related to a method for metal gate work function tuning before contact formation in fin-shaped field effect transistor (FinFET) manufacturing process.

BACKGROUND OF THE INVENTION

In the fabrication of integrated circuit devices, logic products are often produced using salicide (self-aligned silicide) processes in order to obtain higher circuit performance. In silicidation, a refractory metal-containing layer is deposited and then annealed. The underlying silicon reacts with the refractory metal layer to produce a silicide overlying the source and drain regions. The silicided source/drain regions then can have lower resistance than non-silicided regions, especially in smaller geometries, and hence, higher circuit performance.

In order to shrink cell size and enhance performance of a device at a same time, a fin-shaped field effect transistor (FinFET) becomes one of the most important processes in the art. The manufacturing process of a conventional FinFET is much more complicated than a conventional planar field effect transistor. Also due to the complexity of the manufacturing process of the conventional FinFET, there are some defects produced and lowering product yield. For example, work function of a gate is tuned during a gate formation process; however, an annealing have to be performed for silicidation after the gate formation in order to form contacts, and it leads to a problem that work function is altered in the annealing due to thermal effect. Moreover, in any heating or annealing process, the complicated structure and different materials coexist on a same substrate resulting in uneven distribution and absorption of heat. In these cases, temperature of portions of the substrates rise slower during the annealing process or even cannot rise to the desired temperature, and it can cause hardware error or even shutdown. Product yield and productivity reduction and increasing cost become a subject and is needed to be improved.

Accordingly, the present invention provides a manufacturing method for tuning metal gate in order to solve above discussed issues.

SUMMARY OF THE INVENTION

In accordance with an aspect, the present invention provides a method for metal gate work function tuning before contact formation in fin-shaped field effect transistor (FinFET) manufacturing process, where in the method comprises the following steps: step (S1) providing a substrate having a metal gate structure on a side of the substrate, step (S2) forming a titanium nitride (TiN) layer on the side of the substrate, and step (S3) performing a gate annealing to tune work function of the metal gate structure.

In one embodiment of the present invention, the step (S3) is performed under a temperature in a range of 500-800 degree Celsius.

In one embodiment of the present invention, time duration of the step (S3) is in a range of 30-120 seconds.

In one embodiment of the present invention, the titanium nitride (TiN) layer in the step (S2) covers the entire side of the substrate.

In one embodiment of the present invention, the high-side field effect transistor further comprises a plurality of isolations disposed between the gate structure and the drain region and between the drain region and the guard ring.

In one embodiment of the present invention, after the step (S3), the method further comprises step (S4) forming a conductor-line pattern on the side of the substrate.

In one embodiment of the present invention, the step (S4) comprises sub-step (S4-1) forming an etching stop layer on the titanium nitride (TiN) layer and sub-step (S4-2) patterning the titanium nitride (TiN) layer and the etching stop layer to form the conductor-line pattern.

In one embodiment of the present invention, after the step (S3) before the step (S4), the method further comprises step (S31) removing the titanium nitride (TiN) layer and step (S32) forming a resister-metal layer.

In one embodiment of the present invention, wherein the step (S4) comprises sub-step (S4-1') forming an etching stop layer on the resister-metal layer and sub-step (S4-2') patterning the resister-metal layer and the etching stop layer to form the conductor-line pattern.

In one embodiment of the present invention, wherein the substrate has a source and a drain on two sides of the gate structure; and after the step of performing the gate annealing, the contact formation comprises step (S5) performing an contact etching from the side of the substrate to expose the source, drain and metal gate structure and step (S6) forming a contact silicide layer on the source, drain and metal gate structure.

In one embodiment of the present invention, after the step (S4) before the step (S5), the method further comprises step (S41) forming an interlayer (a second dielectric interlayer) on the surface of the substrate.

In one embodiment of the present invention, wherein the step (S6) comprises sub-step (S6-1) depositing a metal-containing layer on the exposed source and drain and sub-step (S6-2) performing a silicide annealing.

In one embodiment of the present invention, wherein the sub-step (S6-2) is performed under a temperature lower than a temperature performed in the step (S3).

In one embodiment of the present invention, wherein the step (S3) is performed under a temperature in a range of 500-800 degree Celsius, and the sub-step (S6-2) is performed under a temperature in a range of 400-700 degree Celsius.

Accordingly, the present invention provides a manufacturing method for metal gate work function tuning before contact formation in fin-shaped field effect transistor (FinFET) manufacturing process in order to enhance product yield and productivity by fixing work function of the metal gate structure and improve heat absorption of the substrate.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a manufacturing method for metal gate work function tuning before contact formation without being altered later on in FinFET manufacturing process and is described more specifically with reference to the following embodiments. It is to be noted that the following descriptions of preferred embodiments of this invention are presented herein for purpose of illustration and description only but not intended to be exhaustive or to be limited to the precise form disclosed.

Figure 1:
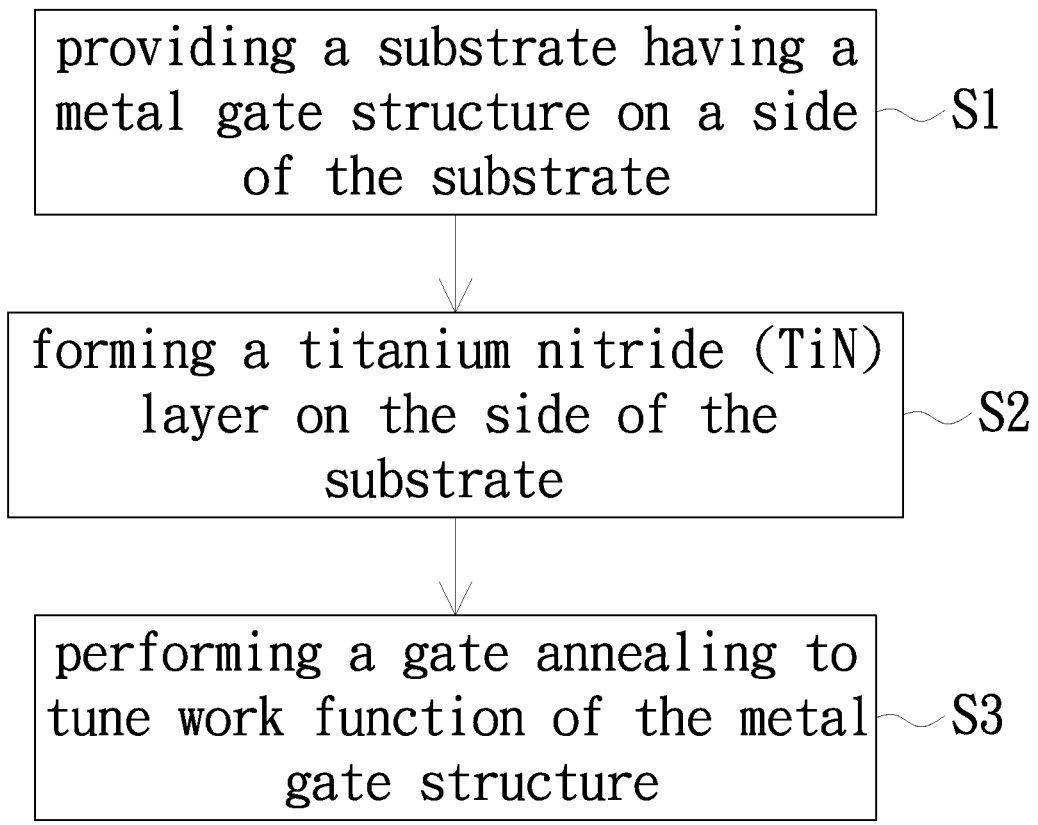
FIG. 1 is a flow chart of a metal gate work function tuning method according to an embodiment of the present invention.

As shown in FIG. 1 illustrating a flow chart of a metal gate work function tuning method according to an embodiment of the present invention, which includes the following steps: step (S1) is to provide a substrate having a metal gate structure on a side of the substrate, step (S2) is to form a titanium nitride (TiN) layer on the side of the substrate, step (S3) is to perform a gate annealing to tune work function of the metal gate structure. The substrate may also include fin-shaped source/drain, dielectric layers, interlayer, isolations, and etc. The step (S2) has to be performed after gate formation of a FinFET, so that the substrate can include any elements necessary or formed before or during gate formation in a conventional FinFET manufacturing process. The TiN layer formed in the step (S2) covers on the entire side of the substrate. A temperature of the step (S3) is in a range of 500-800 degree Celsius and has to be higher than a temperature of an annealing for contact silicide later on in the FinFET manufacturing process. And time duration of the gate annealing of the step (S3) is in a range of 20-30 seconds.

Work function is more fixable under higher thermal effect and less alterable under lower thermal effect. Therefore, work function of the gate structure is fixed in the gate annealing in the step (S3), and as long as temperatures for heating/annealing later in the manufacturing process are not higher than the temperature of the gate annealing, work function is fixed and not altered. Moreover, due to the hardware limitation, the heat source is usually provided from top of the substrate. In the present invention, the TiN layer covering on the entire side of the substrate becomes heat absorbing media, and thus the TiN layer can make heat evenly absorbed by the substrate during the gate annealing.

Figure 2A:
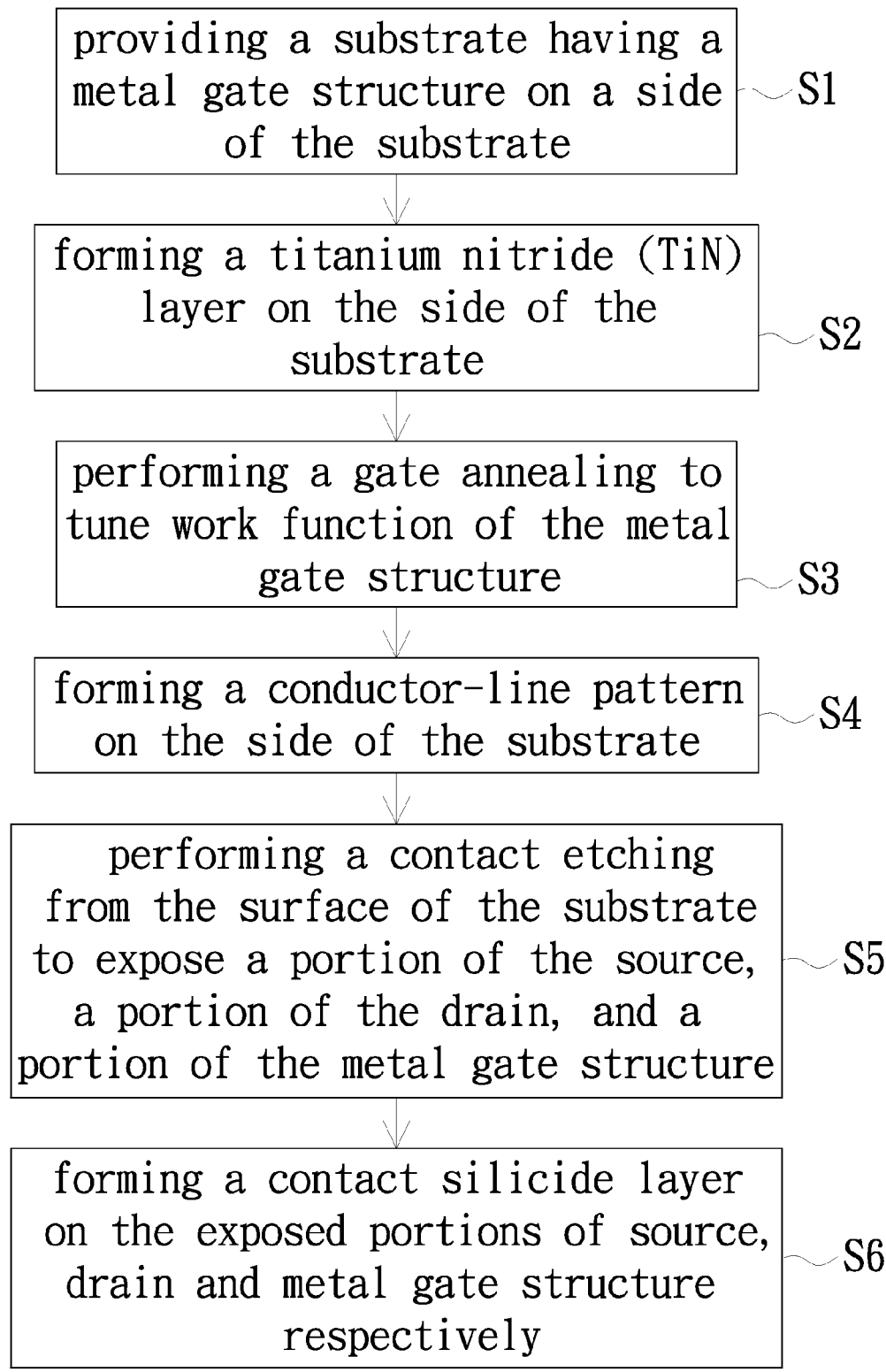
FIGS. 2a-2d are flow charts of metal gate work function tuning applied with contact formation according to several embodiments of the present invention.

FIG. 2a is a flow chart of the metal gate work function tuning method applied with contact formation thereafter according to one embodiment of the present invention, the steps (S1)-(S3) are the same as illustrated in FIG. 1 and above paragraphs, and the aforementioned method applied with contact formation thereafter further comprises step (S4) forming a conductor-line pattern on the side of the substrate, step (S5) performing a contact etching from the side of the substrate to expose a portion of the source, a portion of the drain, and a portion of the metal gate structure, and step (S6) forming a contact silicide layer on the exposed portions of the source, the drain and the metal gate structure, respectively.

Figure 2B:
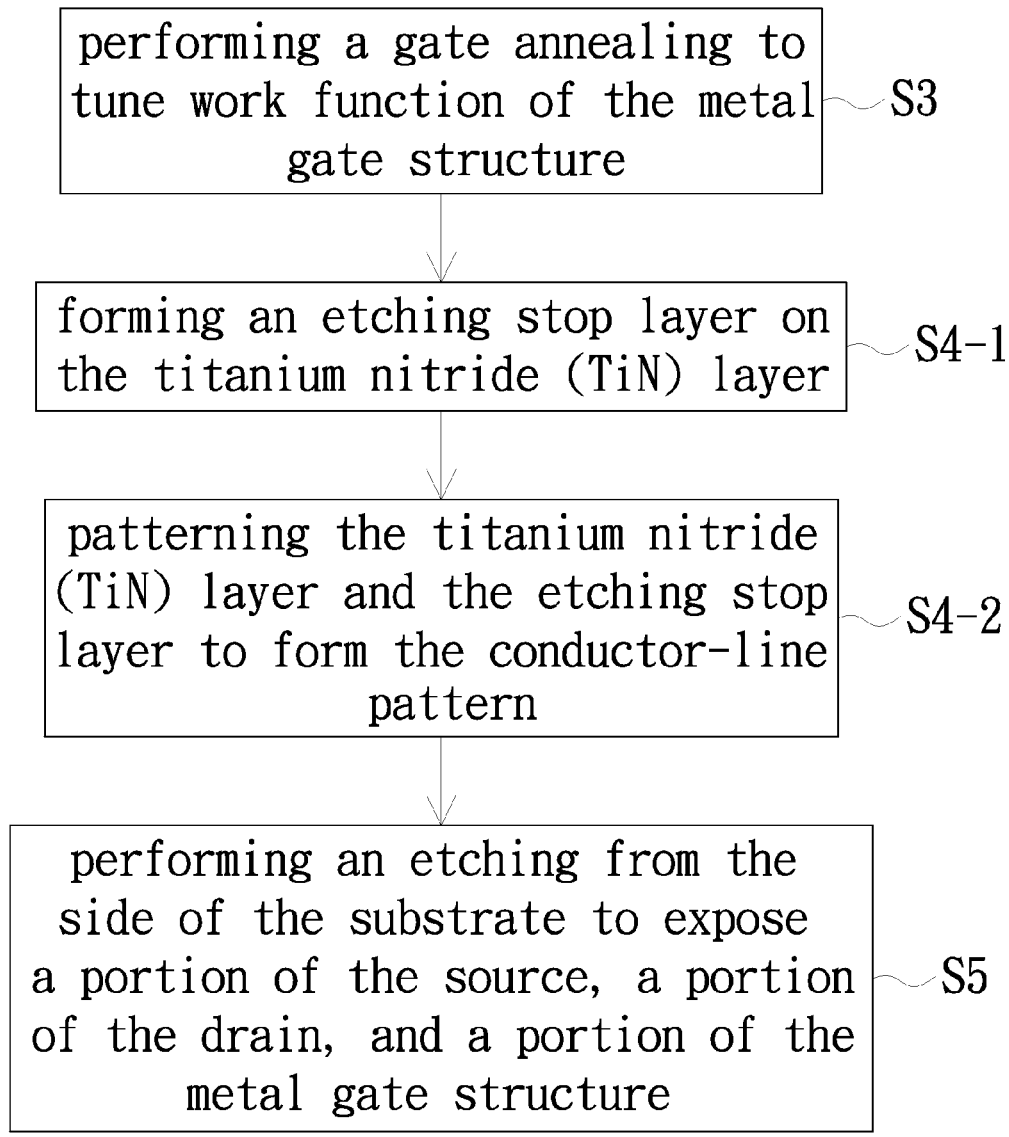

In the step (S4), the conductor-line pattern can be formed by the following sub-steps: firstly, sub-step (S4-1) forming an etching stop layer on the titanium nitride (TiN) layer and then sub-step (S4-2) patterning the titanium nitride (TiN) layer and the etching stop layer to form the conductor-line pattern, as shown in FIG. 2b in an alternative embodiment.

The TiN layer cannot just be a heat absorbing media but also a conductor line due to its conductivity. Moreover, since the TiN also have a material character/property of high resistance, it can adjust resistance parameter of the device by balancing lower resistance of the metal gate structure.

Figure 2C:
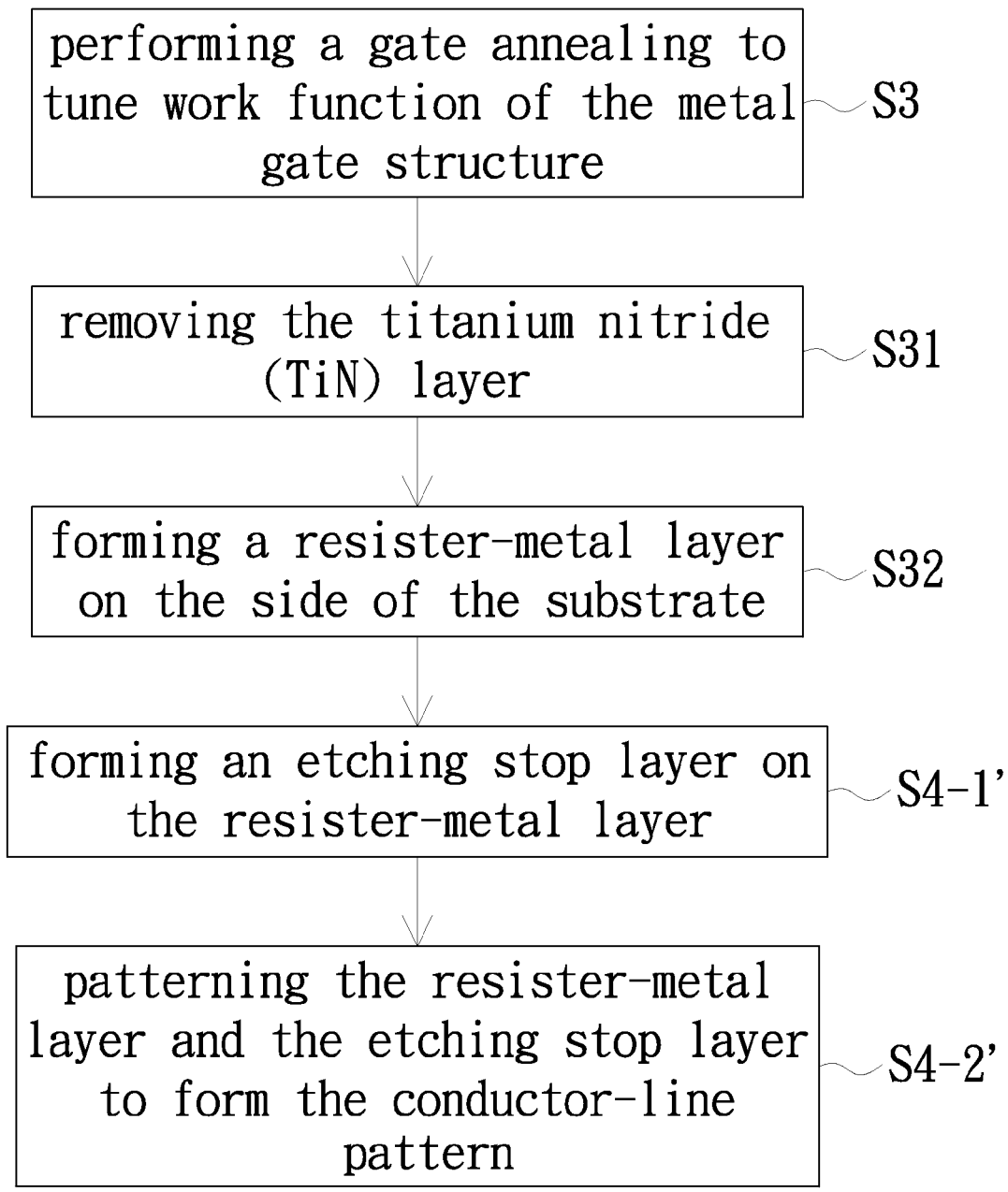

However, if the TiN layer is not suitable to be material of the conductor line in some circumstances, the TiN layer can be removed after the step (S3). As shown in FIG. 2c for an alternative embodiment, step (31) is to remove the titanium nitride (TiN) layer and then step (S32) is performed to form a resister-metal layer on the side of the substrate. Then the step (S4) is performed as described above after the step (S32). But in this case, the step (S4) for this alternative embodiment alternatively comprises the following sub-steps: sub-step (S4-1') forming an etching stop layer on the resister-metal layer, and then sub-step (S4-2') patterning the resister-metal layer and the etching stop layer to form the conductor-line pattern. The resister-metal layer here in this embodiment can be any metal-containing material other than TiN.

Figure 2D:
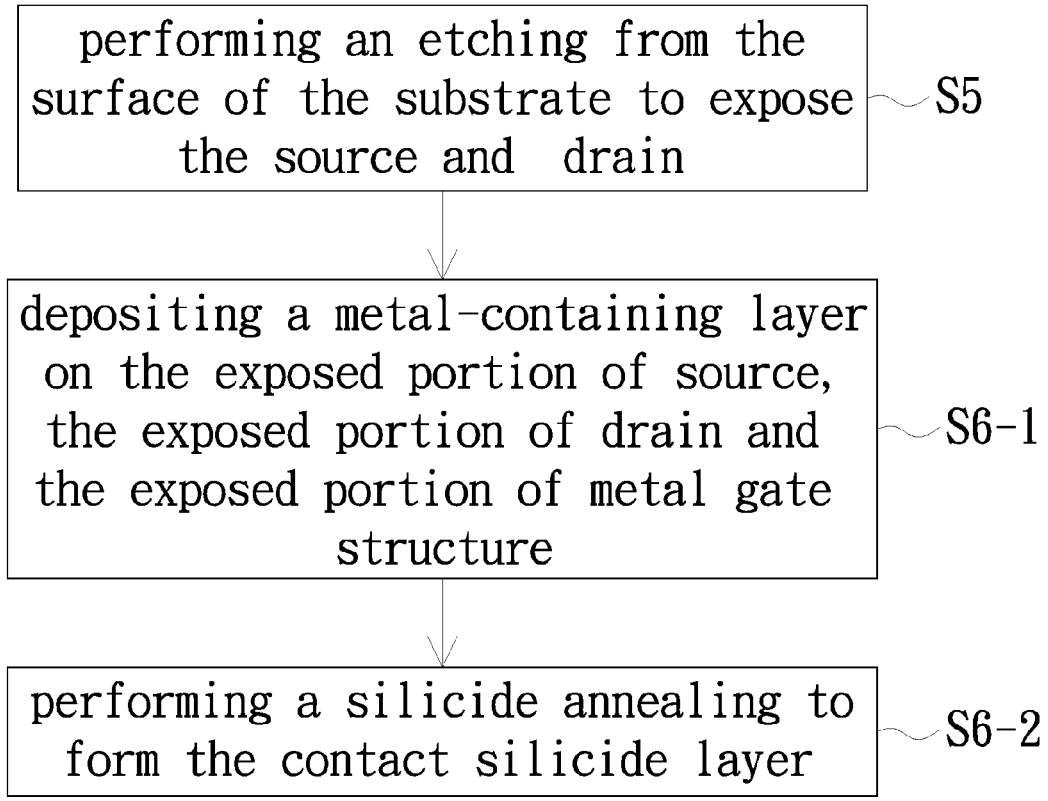

The step (S6) of forming a contact silicide layer on the exposed portions of source, drain and metal gate structure respectively can comprises the following sub-steps: sub-step (S6-1) depositing a metal-containing layer on the exposed portion of source, the exposed portion of drain and the exposed portion of metal gate structure, and sub-step (S6-2) performing a silicide annealing to form the contact silicide layer, as shown in FIG. 2d in one embodiment. A temperature of the silicide annealing in the sub-step (S6-2) is in a range of 400-700 degree Celsius and has to be lower than the temperature of the gate annealing of the step (S3).

The step (S5) can be considered as the first step of contact formation. Thus, the conductor-line pattern can also be etched in the same step (S5), and the TiN layer/resister-metal layer is exposed depending on different cases. Then the contact silicide layer is formed on the exposed TiN layer/resister-metal layer as well in the step (S6).

In accordance with illustration above, the present invention provides a manufacturing method for tuning metal gate work function before formation of a contact in FinFET manufacturing process to enhance product yield by fixed (or unaltered) work function of the metal gate structure and improve heat absorption of the substrate. In order to illustrate the present invention in more details, an embodiment with specific structure is provided below according to the steps (and sub-steps) of the FIGS. 2a-2b, and 2d (the embodiment uses TiN layer as a conductor line). FIGS. 3a-3j are cross-sectional diagrams illustrating intermediate structures of a FinFET according to the embodiment of the present invention, and materials used for source/drain, interlayer, dielectric layer, metal gate, and etc. are conventional, so verbose explanation are omitted.

Figure 3A:
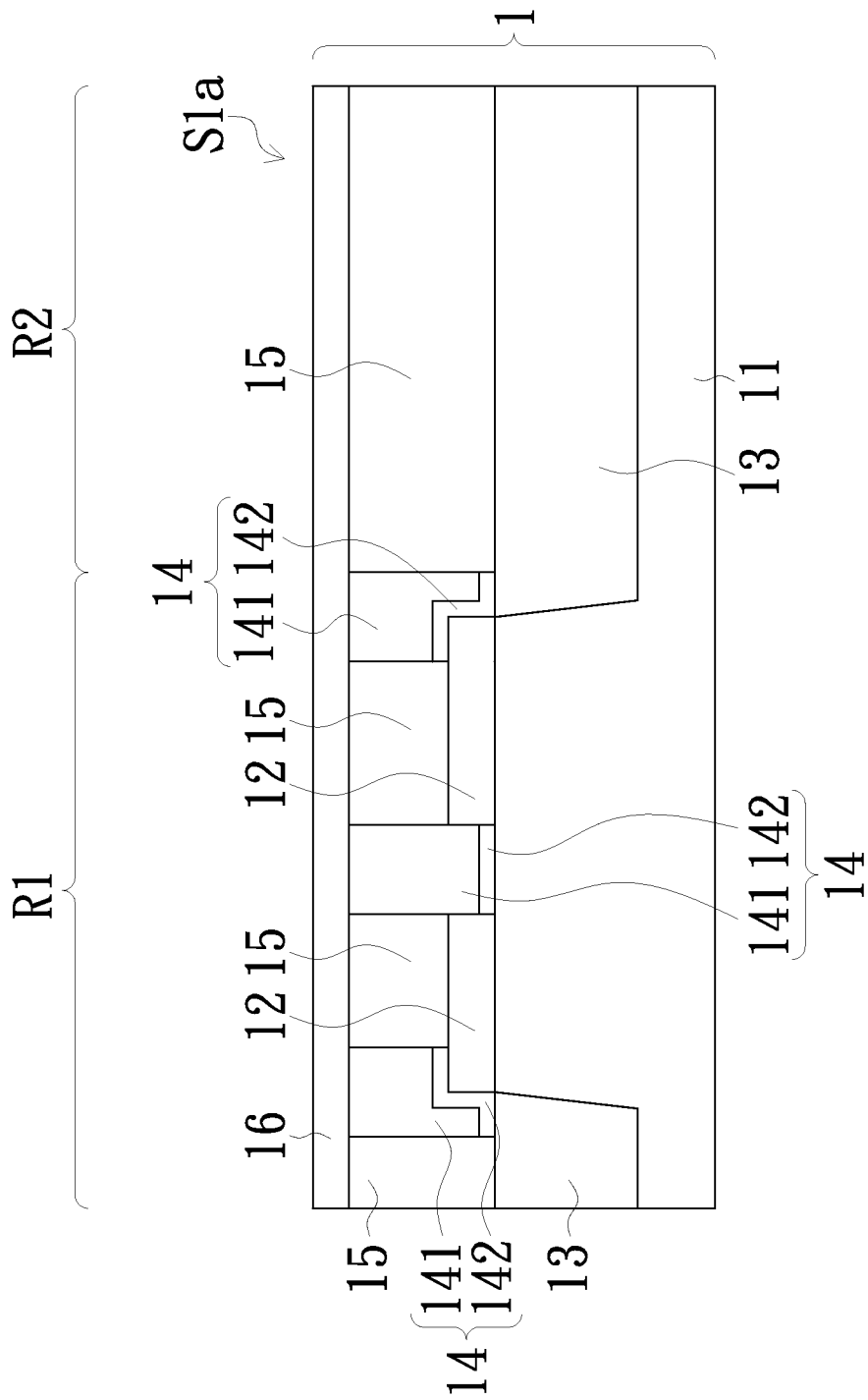
FIGS. 3a-3j are cross-sectional views of different manufacturing steps of a FinFET according to the embodiment of the present invention.

According to the embodiment of the present invention as shown in FIG. 3a in accordance with the step (S1), a substrate 1 having a base 11, a source/drain 12, a metal gate structure 14, a first dielectric interlayer 15, and an oxide layer 16 is provided. The substrate 1 has an element region R1 and a peripheral region R2. The source/drain 12 is disposed on the base 11 on a side S1a of the substrate 1. A plurality of isolations 13 are disposed in the base 11 on two sides of the source/drain 12 in both the element region R1 and the peripheral region R2. The metal gate structure 14 is on and across the source/drain 12 in the element region R1, wherein the metal gate structure 14 includes at least a gate electrode 141 and a high-k gate dielectric layer 142, and the source/drain 12 is disposed in the element region R1 on two opposite sides of the metal gate structure 14. And the first dielectric interlayer 15 is disposed in the element and peripheral region R1 and R2, in-between the metal gate structure 14 on the base 11 and the source/drain 13 on the side S1a of the substrate 1. The oxide layer 16 is disposed on the side S1a of the substrate 1.

Figure 3B:
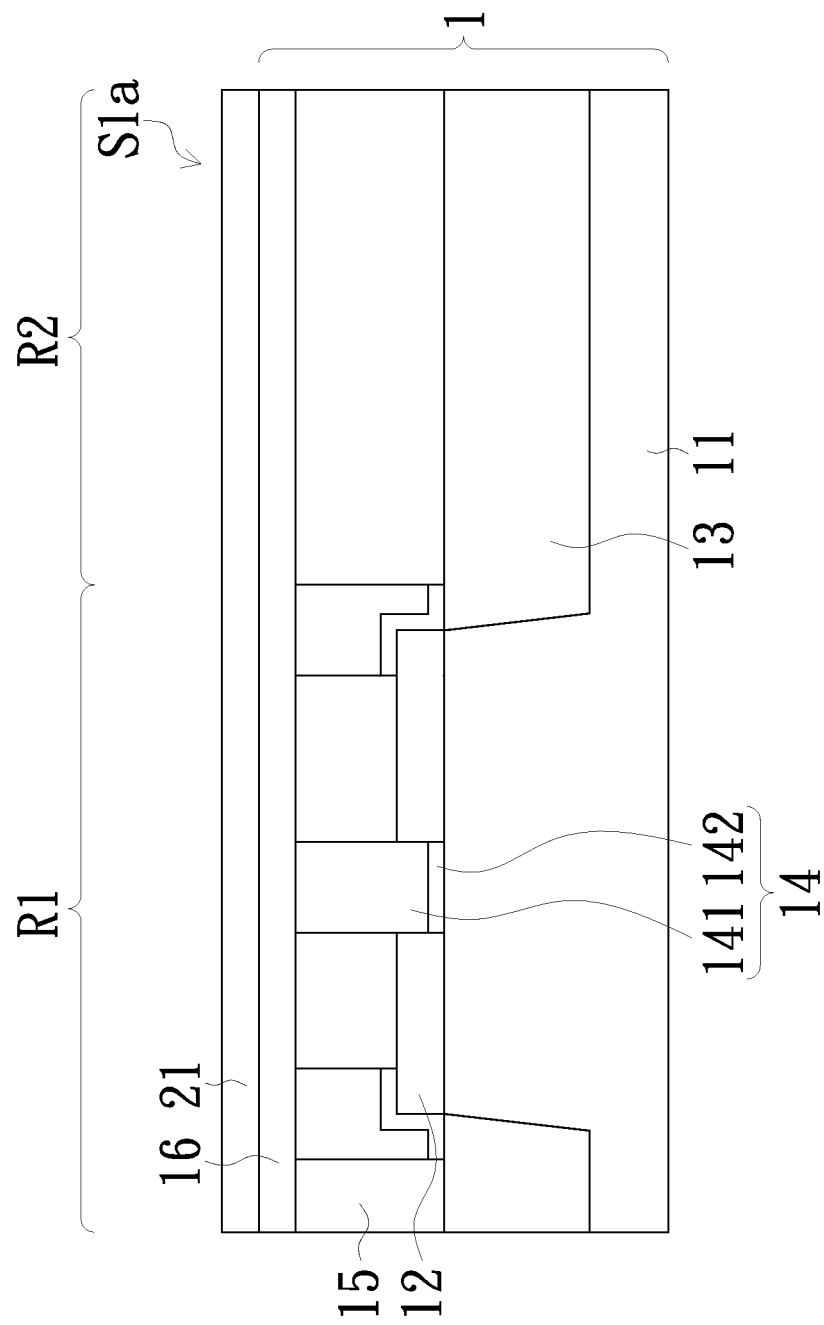
Figure 3C:
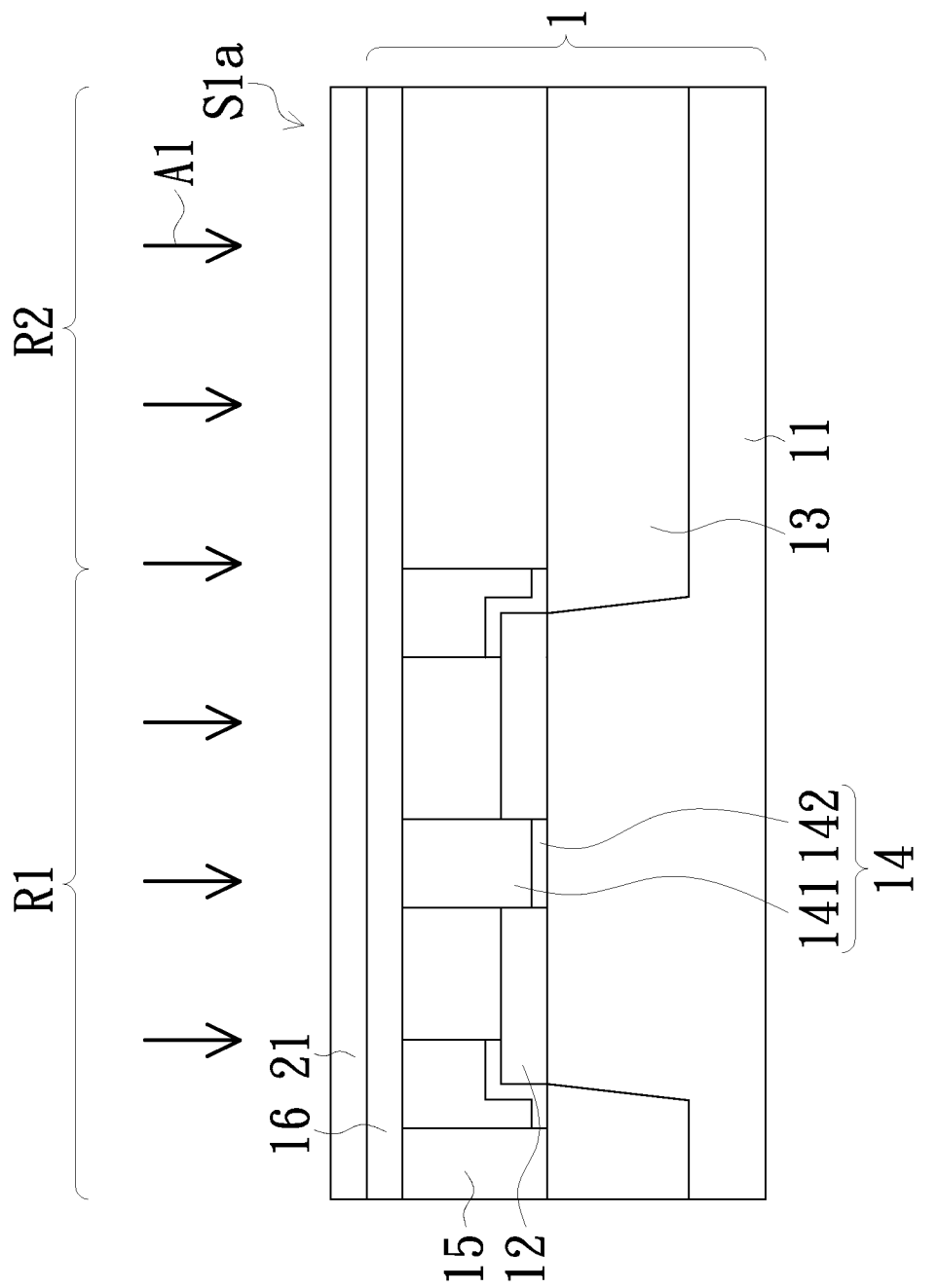
Figure 3D:
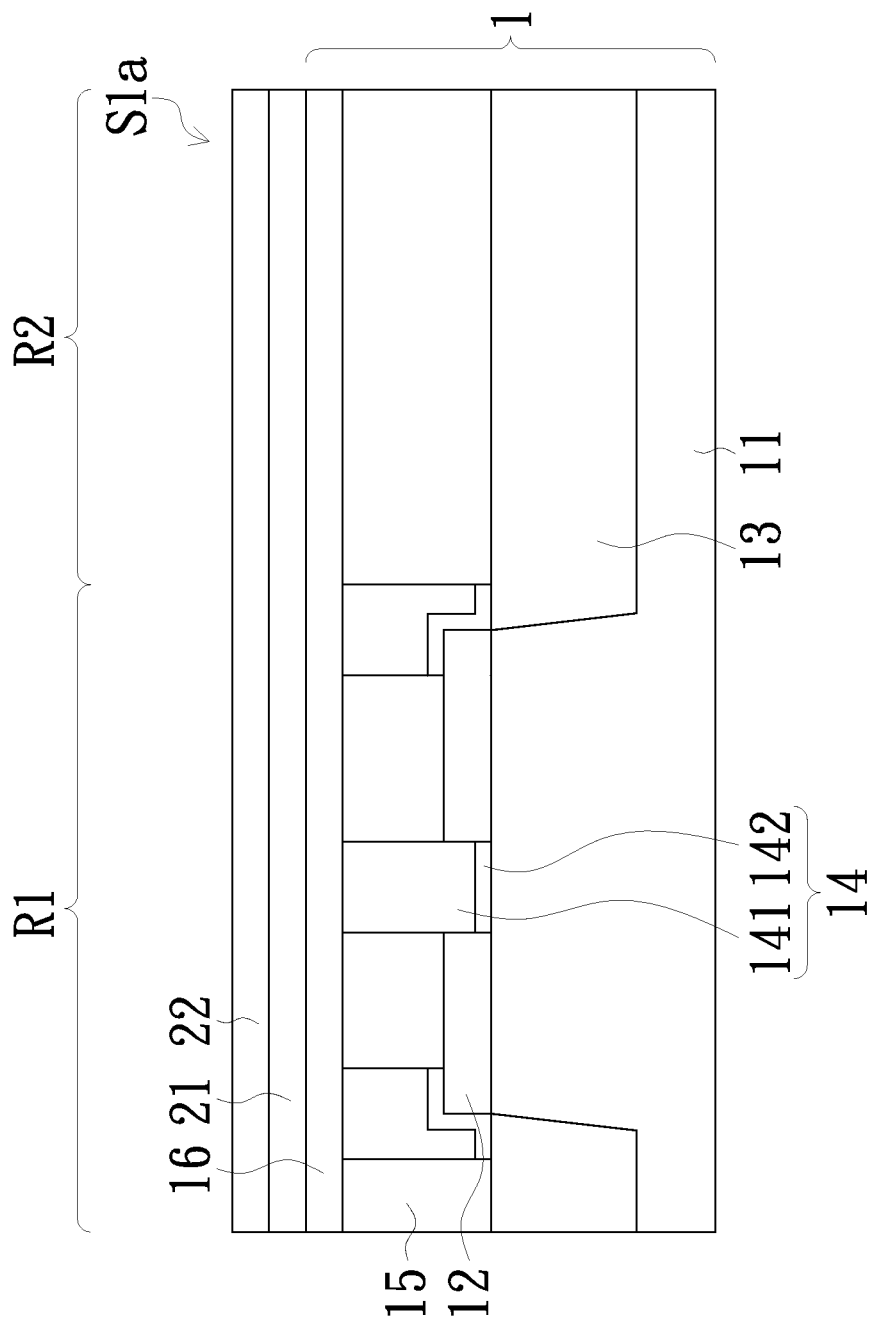
Figure 3E:
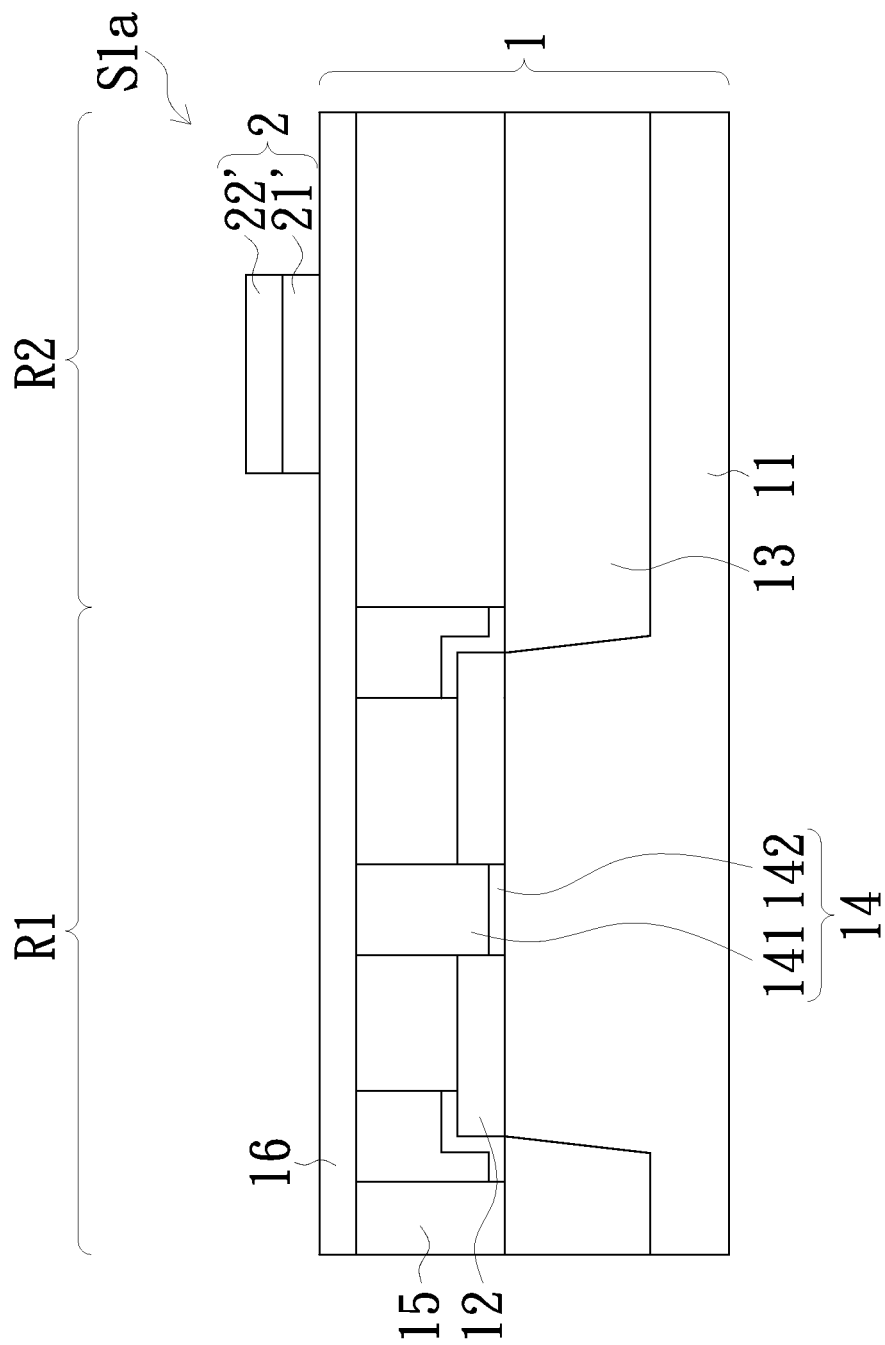
Figure 3F:
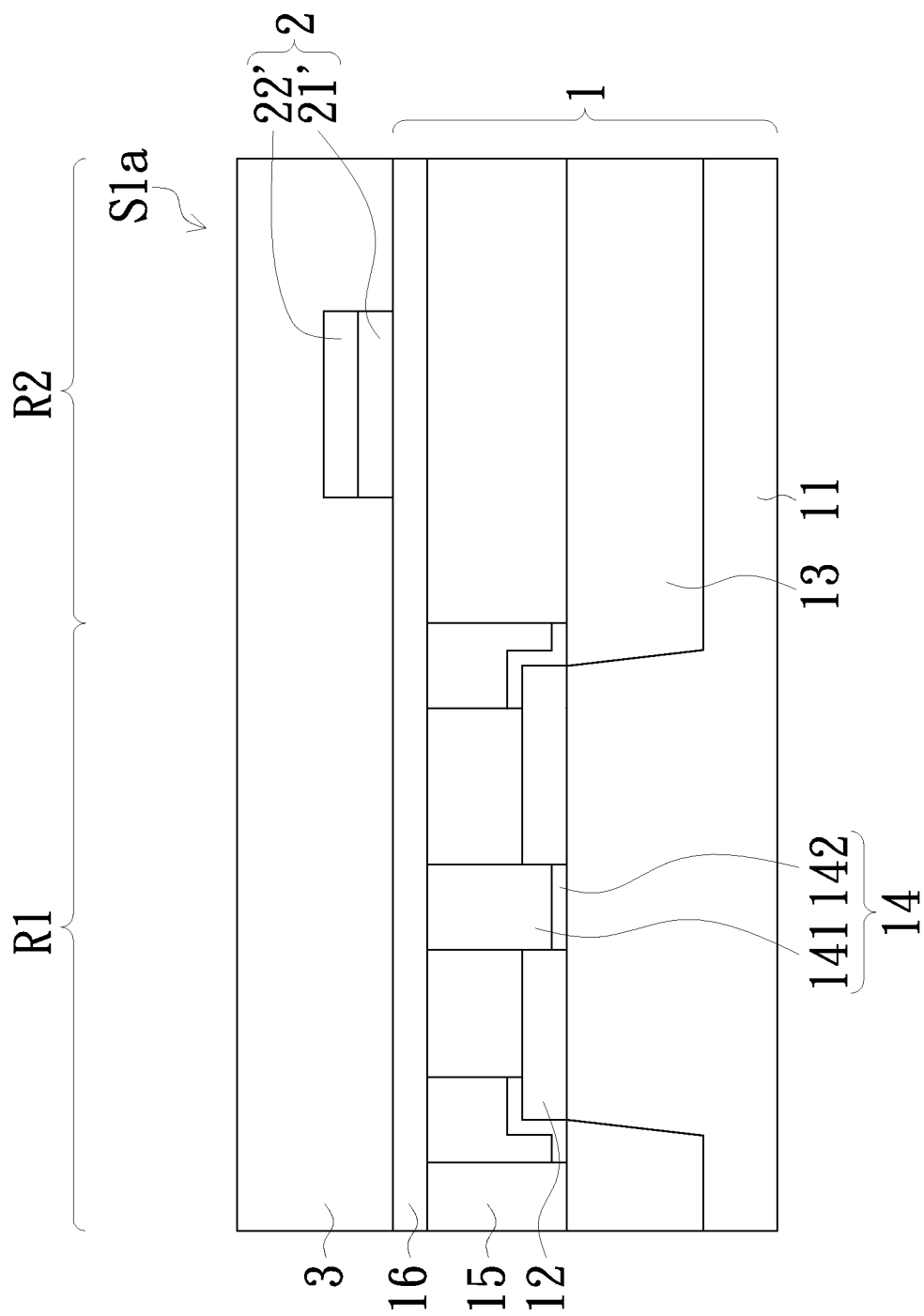
Figure 3G:
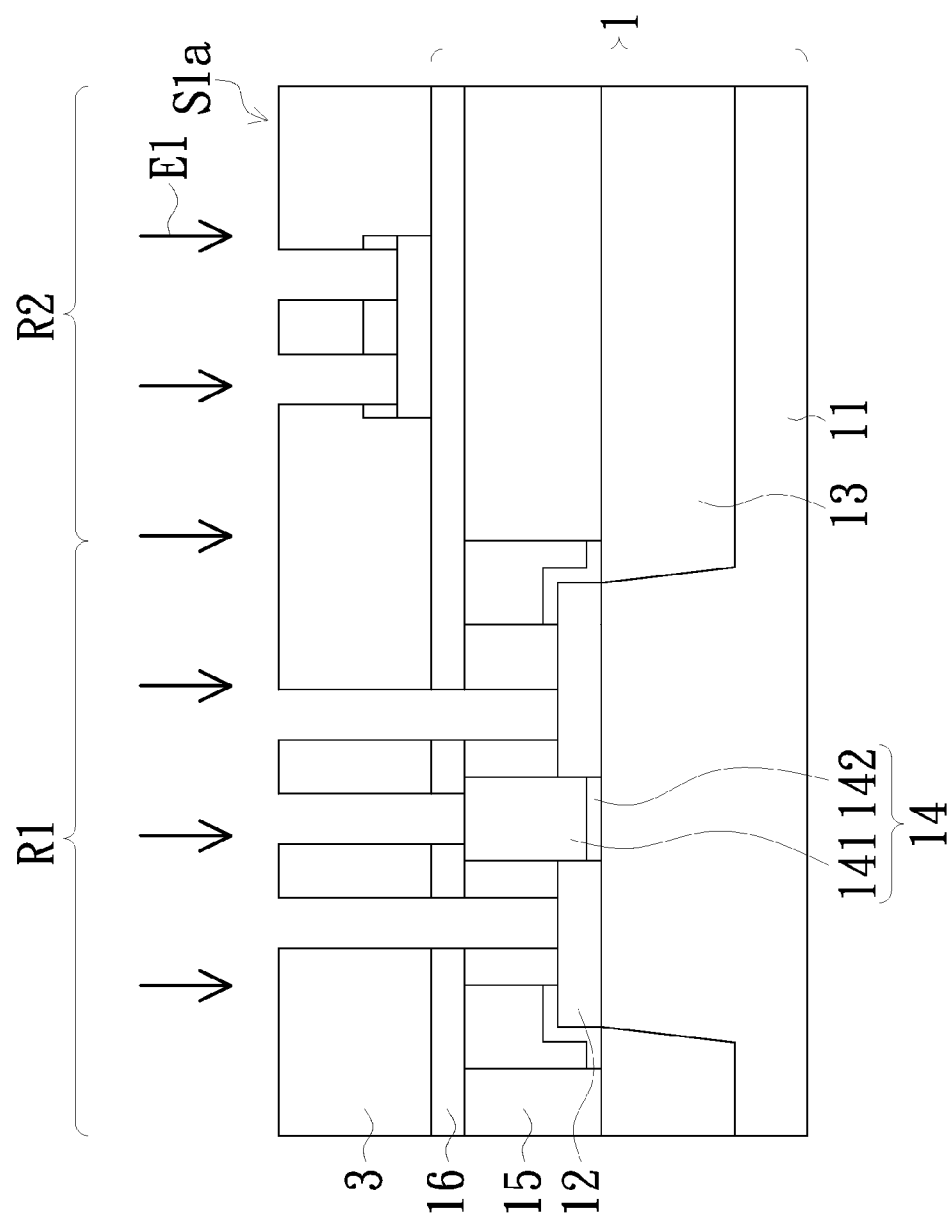
Figure 3H:
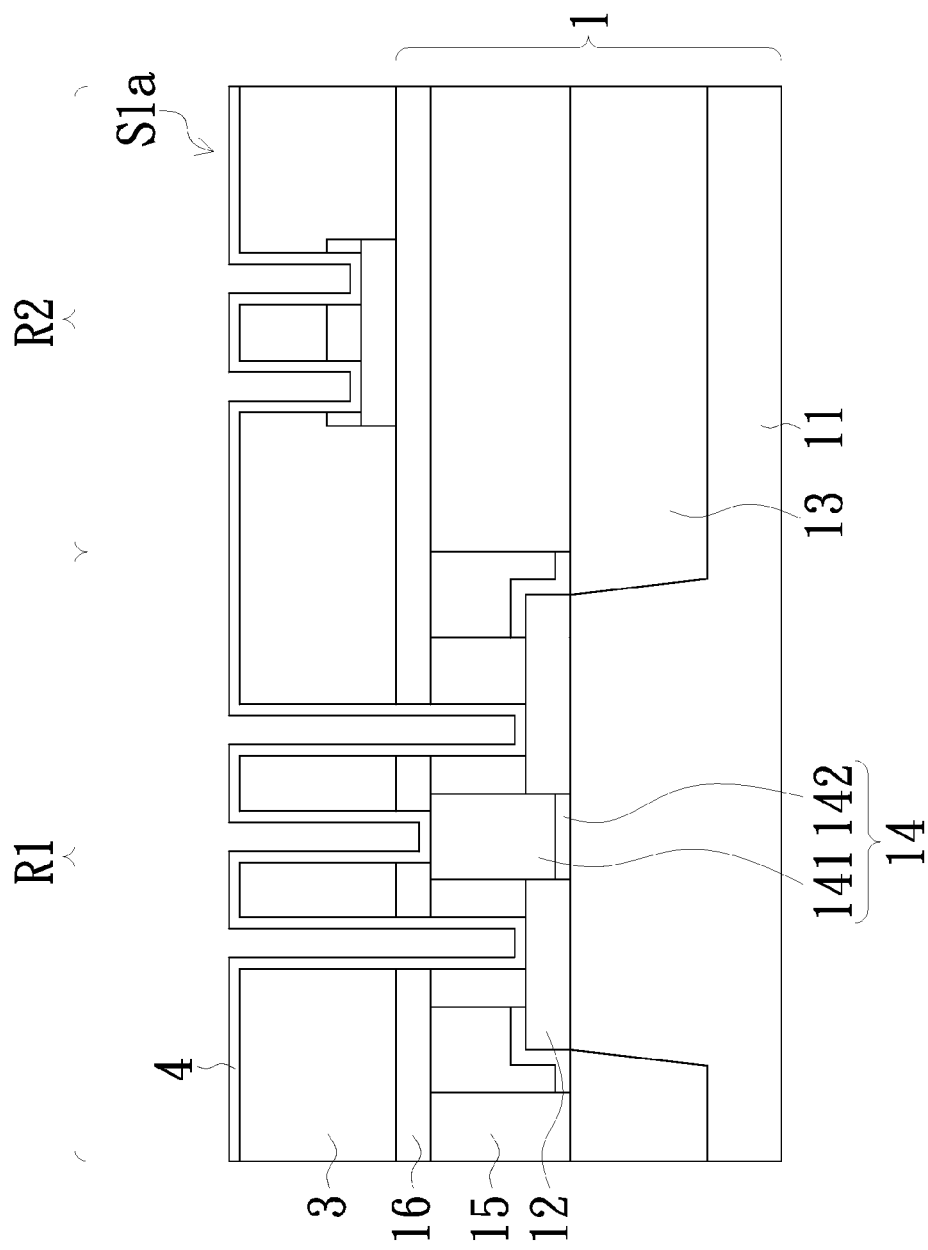
Figure 3I:
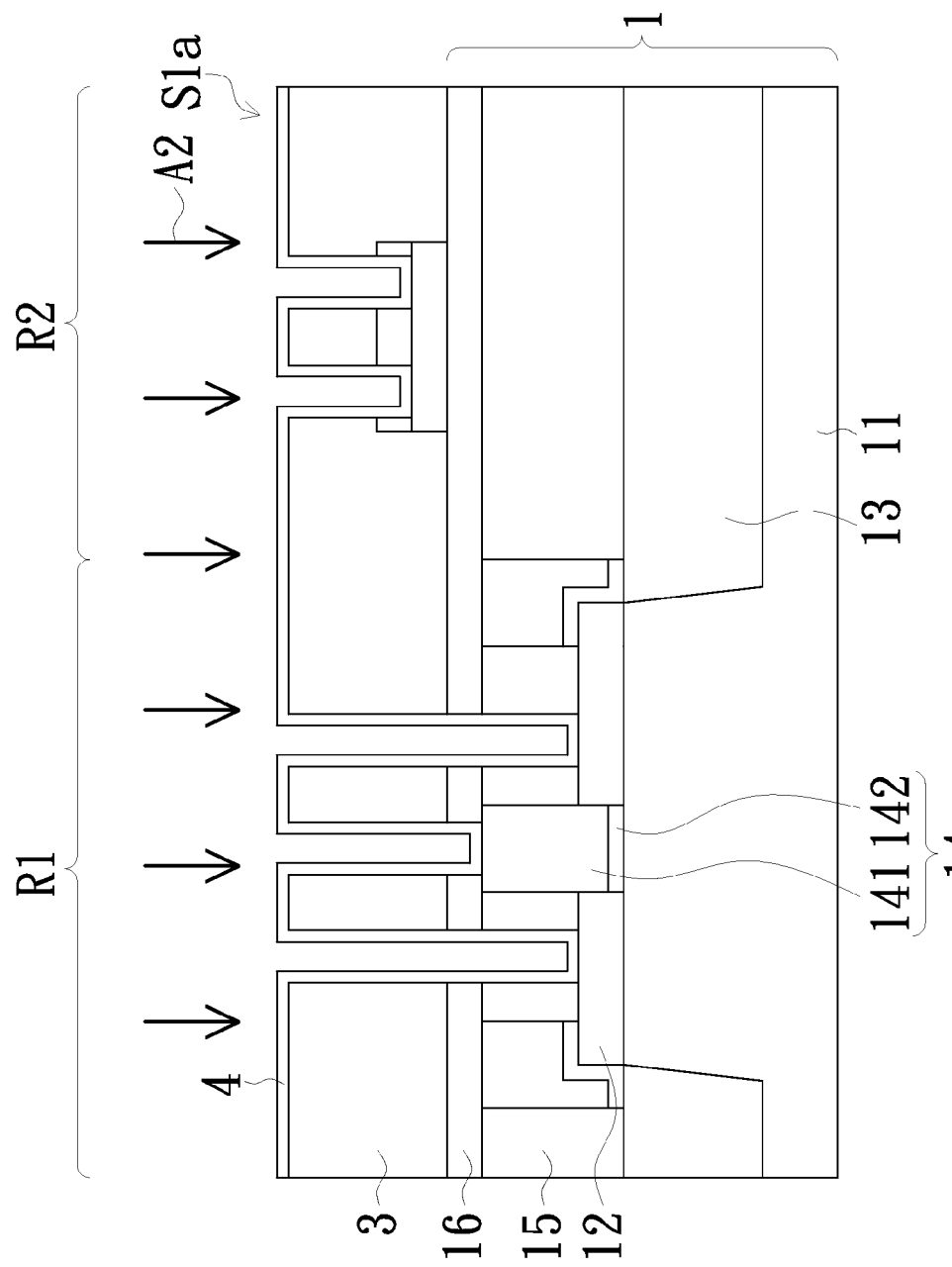
Figure 3J:
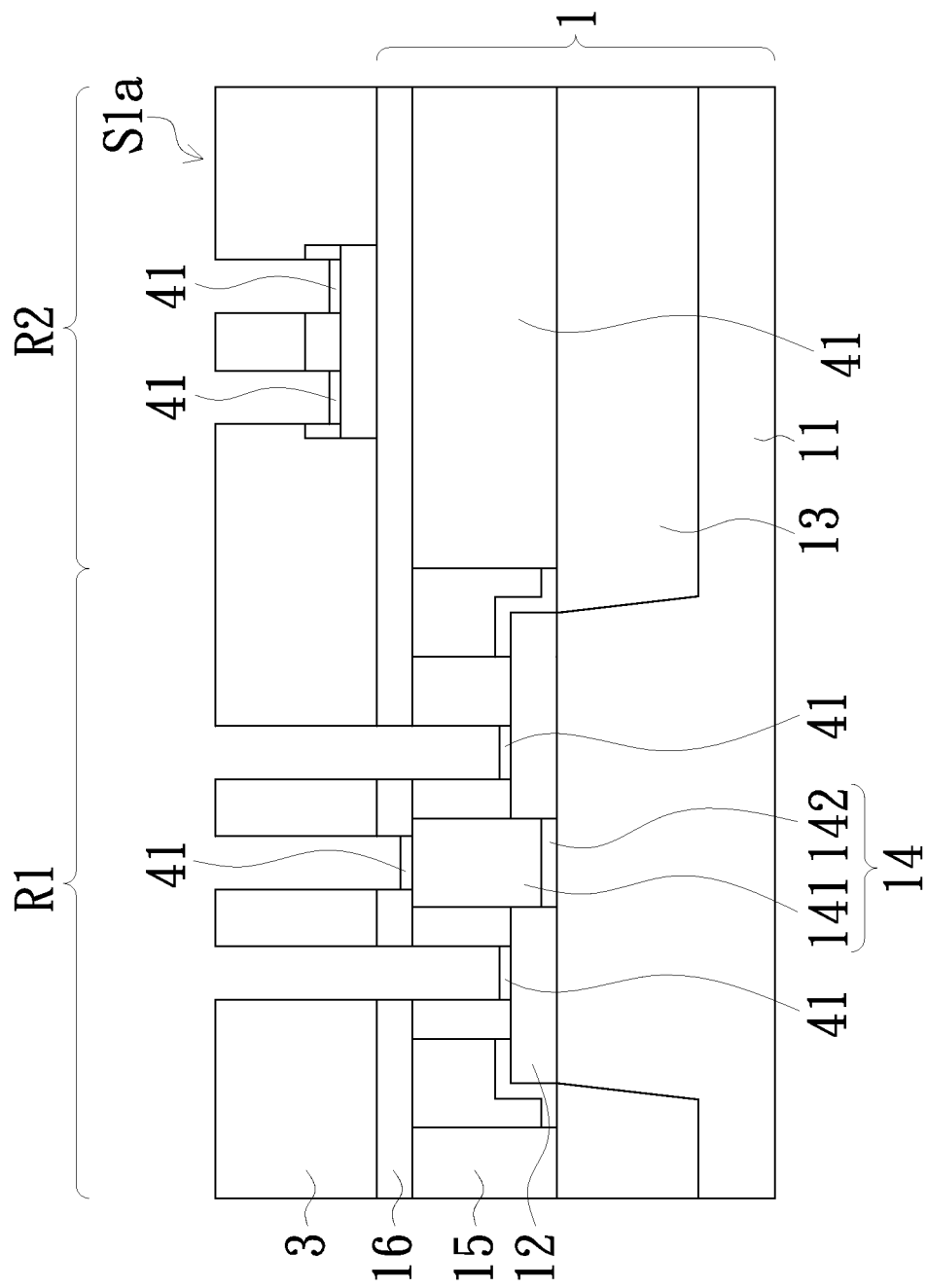

Then as shown in FIGS. 3b-3c in accordance with the steps (S2)-(S3), a titanium nitride (TiN) layer 21 is formed on the side S1a of the substrate 1, and a gate annealing A1 is performed to tune work function of the metal gate structure 14. In accordance with the sub-step (S4-1) as shown in FIG. 3d, an etching stop layer 22 is formed on the titanium nitride (TiN) layer 21. And then a contact etching is performed to pattern the titanium nitride (TiN) layer 21 and the etching stop layer 22 to form a conductor-line pattern 2, which comprises a patterned TiN layer 21' and a patterned etching stop layer 22', on the side S1a of the substrate 1 in the periphery region R2 as shown in FIG. 3e in accordance with the sub-step (S4-2). In step (S41), a second dielectric interlayer 3 is formed on the conductor-line pattern 2 and the oxide layer 16 on the side S1a of the substrate 1 as shown in FIG. 3f in this embodiment before performing the step (S5), the first step of the contact formation. FIG. 3g shows that in accordance with the step (S5), a contact etching E1 is then performed to expose a portion of the source/drain 12, a portion of the metal gate electrode 141 of the metal gate structure 14, and also a portion of the patterned TiN layer 21'. Subsequently, a metal-containing layer 4 is deposited conformably on the side S1a of the substrate 1 as shown in FIG. 3h in accordance with the sub-step (S6-1). A silicide annealing A2 is performed as shown in FIG. 3i in accordance with the sub-step (S6-2). Only portions of the metal-containing layer 4 on the exposed source/drain 13, the metal gate electrode 141 and the patterned TiN layer 21' react to form a contact silicide layer 41, and the rest of the metal-containing layer 4 is removed as shown in FIG. 3j.

In another embodiment of the present invention, the TiN layer is removed and a resister-metal layer is replaced thereon (not shown). It follows the same process/method as illustrated in FIGS. 2a, 2c, and 2d. The resister-metal layer is exposed in the step (S5), and the contact silicide layer is also formed on the exposed resister-metal layer in the sub-step (6-2). Even in different circumstances, the spirit of the present invention is unchanged and the steps provided by the present invention are majorly the same.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for metal gate work function tuning before contact formation in fin-shaped field effect transistor (Fin-FET) manufacturing process, comprising steps of:
   (S1) providing a substrate having a metal gate structure on a side of the substrate, wherein the metal gate structure is of multigate;
   (S2) forming a titanium nitride (TiN) layer on the side of the substrate covering the entire metal gate structure;
   (S3) performing a gate annealing to tune work function of the metal gate structure; and
   (S4) forming a conductor-line pattern on the side of the substrate, comprising sub-steps of:
      (S4-1) forming an etching stop layer on the titanium nitride (TiN) layer; and
      (S4-2) patterning the titanium nitride (TiN) layer and the etching stop layer to form a patterned titanium nitride (TiN) layer and a patterned etch stop layer, wherein the patterned titanium nitride (TiN) layer and the patterned etching stop layer together form the conductor-line pattern.

2. The method for metal gate work function tuning before contact formation in fin-shaped field effect transistor (FinFET) manufacturing process according to claim 1, wherein the step (S3) is performed under a temperature in a range of 500-800 degree Celsius.

3. The method for metal gate work function tuning before contact formation in fin-shaped field effect transistor (FinFET) manufacturing process according to claim 1, wherein time duration of the step (S3) is in a range of 30-120 seconds.

4. The method for metal gate work function tuning before contact formation in fin-shaped field effect transistor (FinFET) manufacturing process according to claim 1, wherein the titanium nitride (TiN) layer in the step (S2) covers the entire side of the substrate and the conductor-line pattern is formed in a periphery region.

5. A method for contact formation following the metal gate work function tuning of claim 1, wherein the substrate has a source and a drain on two sides of the gate structure; and after the step (S4) of claim 1, comprising steps of:
   (S5) performing a contact etching from the side of the substrate to expose a portion of the source, a portion of the drain and a portion of the metal gate structure; and
   (S6) forming a contact silicide layer on the exposed portions of source, drain and metal gate structure respectively.

6. The method for contact formation according to claim 5, after the step (S4) before the step (S5), further comprising a step of:
   (S41) forming an interlayer on the surface of the substrate.

7. The method for contact formation according to claim 6, wherein the step (S6) comprises sub-steps of:
   (S6-1) depositing a metal-containing layer on the exposed portion of source, the exposed portion of drain and the exposed portion of metal gate structure; and
   (S6-2) performing a silicide annealing to form the contact silicide layer.

8. The method for contact formation according to claim 7, wherein the sub-step (S6-2) is performed under a temperature lower than a temperature performed in the step (S3).

9. The method for contact formation according to claim 8, wherein the step (S3) is performed under a temperature in a range of 500-800 degree Celsius, and the sub-step (S6-2) is performed under a temperature in a range of 400-700 degree Celsius.

* * * * *